United States Patent
Ellis-Monaghan et al.

(10) Patent No.: US 10,103,280 B1
(45) Date of Patent: Oct. 16, 2018

(54) RAPID MELT GROWTH PHOTODETECTOR

(71) Applicant: International Business Machines Corporation, Armonk, NY (US)

(72) Inventors: John J. Ellis-Monaghan, Grand Isle, VT (US); Edward W. Kiewra, South Burlington, VT (US); Jason S. Orcutt, Katonah, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/486,810

(22) Filed: Apr. 13, 2017

(51) Int. Cl.
  *H01L 31/02* (2006.01)
  *H01L 31/0232* (2014.01)
  *G02B 6/42* (2006.01)
  *G02B 6/12* (2006.01)

(52) U.S. Cl.
  CPC ...... *H01L 31/02327* (2013.01); *G02B 6/4295* (2013.01); *G02B 2006/12061* (2013.01)

(58) Field of Classification Search
  None
  See application file for complete search history.

(56) References Cited

U.S. PATENT DOCUMENTS

| | | |
|---|---|---|
| 7,122,392 B2 | 10/2006 | Morse |
| 7,196,400 B2 | 3/2007 | Yamazaki et al. |
| 7,902,620 B2 | 3/2011 | Assefa et al. |
| 8,304,272 B2 | 11/2012 | Assefa et al. |
| 8,343,792 B2 | 1/2013 | Carothers et al. |
| 8,853,812 B2 * | 10/2014 | Okamoto ........... G02B 6/12004 257/458 |
| 9,171,971 B2 | 10/2015 | Ellis-Monaghan et al. |
| 9,178,085 B2 | 11/2015 | Li |

(Continued)

OTHER PUBLICATIONS

Littlejohns, C & Domínguez Bucio, Thalía & Nedeljkovic, Milos & Wang, Hong & Z. Mashanovich, Goran & T. Reed, Graham & Y. Gardes, Frederic. (2016). Towards a fully functional integrated photonic-electronic platform via a single SiGe growth step. Scientific Reports. 6. 19425. 10.1038/srep19425.*

(Continued)

*Primary Examiner* — Charles Garber
*Assistant Examiner* — Alia Sabur
(74) *Attorney, Agent, or Firm* — Law Offices of Ira D. Blecker, P.C.

(57) ABSTRACT

Photodetector including: a waveguide of a waveguide material extending over a substrate; an insulating layer formed over the waveguide and having an opening exposing the waveguide; a photodetector layer formed over the insulating layer and into the opening so as to make contact with the waveguide, the photodetector layer having a first end at the opening and a second end distal from the opening, the photodetector layer being a gradient material of the waveguide material and germanium wherein a waveguide material portion of the gradient material varies from a maximum at the first end to a minimum at the second end and wherein a germanium portion of the gradient material varies from a minimum at the first end to a maximum at the second end; a photodetector region at the second end; and a photodetector layer extension extending at an angle from the photodetector layer at the second end.

25 Claims, 7 Drawing Sheets

(56) References Cited

U.S. PATENT DOCUMENTS 9,224,882 B2    12/2015  Na et al.
2017/0175294 A1*  6/2017  Gardes .................... C30B 29/52

OTHER PUBLICATIONS

H. Melchior et al., "Atlanta fiber system experiment: Planar epitaxial silicon avalanche photodiode," The Bell System Technical Journal, vol. 57, No. 6, 1978, pp. 1791-1807.
S. Assefa et al., "Reinventing germanium avalanche photodetector for nanophotonic on-chip optical interconnects," Nature, vol. 464, No. 7285, 2010, pp. 80-84.
R. Going et al., "Metal-optic cavity for a high efficiency sub-fF Germanium photodiode on a Silicon waveguide," Optics Express, vol. 21, No. 19, 2013, pp. 22429-22440.

\* cited by examiner

RAPID MELT GROWTH PHOTODETECTOR

BACKGROUND

The present exemplary embodiments pertain to optoelectronic devices and, more particularly, to waveguide photodetectors that convert optical signals into electrical signals.

In optical communication systems, optical waveguides provide a transmission channel for guiding an optical signal produced by a light source, e.g., a laser, at one end of the system to a detector, e.g., a photodetector, at the other end of the system. The photodetector material, an active region, absorbs energy from the photons of the transmitted optical signal, which, in response, excites charge carriers, e.g., electrons and holes. With the application of a reverse bias voltage, the excited charge carriers are attracted to contacts on the photodetector, thereby creating an electrical current that corresponds to the optical signal. In this manner, the photodetector converts an optical signal into an electrical signal.

Due to its potential for being grown on top of silicon, germanium is an appropriate choice for a photodetector.

A lattice constant refers to the distance between unit cells in a crystal lattice. The lattice constant of germanium is not perfectly matched with the lattice constant of silicon; the lattice constant of germanium is slightly larger than that of silicon. The mismatch between the lattice constants of germanium and silicon presents problems for using a regular epitaxial growth ("EPI") technique for growing crystals. Currently, two main methods have been heavily studied to make single crystal germanium film on top of silicon substrates. One method is using a buffer layer and post-process after selective epitaxial growth ("SEG"). The second method is using a rapid melt growth ("RMG") technique. Between these two methods, RMG has better process compatibility but has a limitation on the structures that can be constructed.

In the RMG technique, single crystal germanium is not grown directly on top of the silicon. Rather, poly-germanium or amorphous germanium is deposited on an insulator that has an opening ("seed window") to an underlying silicon layer. An insulator, such as a nitride, is deposited to surround the poly-germanium or amorphous germanium. The RMG method requires a micro-crucible formed by the insulator surrounding the deposited poly-germanium or amorphous germanium which causes melting and recrystallization of the germanium when subjected to anneal.

Optical detectors in a CMOS compatible process sequence can be accomplished inexpensively with an RMG germanium photodetector. RMG photodetectors have been built in silicon compatible processes but suffer from a couple of difficulties.

One difficulty is that the silicon seed region contaminates the germanium photodetector resulting in a silicon germanium detector rather than a pure crystalline germanium photodetector. This can result in poor responsivity of the photodetector.

Another difficulty is that the melting and subsequent recrystallization of the germanium photodetector can result in the formation of defects near the end of the photodetector affecting the yield and responsivity of the photodetector.

BRIEF SUMMARY

The various advantages and purposes of the exemplary embodiments as described above and hereafter are achieved by providing, according to an aspect of the exemplary embodiments, a photodetector comprising: a waveguide extending over a substrate, the waveguide comprising a waveguide material; an insulating layer formed over the waveguide, the insulating layer having an opening exposing the waveguide; a photodetector layer formed over the insulating layer and into the opening so as to make contact with the waveguide, the photodetector layer having a first end at the opening and a second end distal from the opening, the photodetector layer being a gradient material of the waveguide material and germanium wherein a waveguide material portion of the gradient material varies from a maximum at the first end to a minimum at the second end and wherein a germanium portion of the gradient material varies from a minimum at the first end to a maximum at the second end; a photodetector region at the second end; and a photodetector layer extension extends at an angle from the photodetector layer at the second end.

According to another aspect of the exemplary embodiments, there is provided a photodetector comprising: a waveguide extending over a substrate, the waveguide comprising silicon; an insulating layer formed over the waveguide, the insulating layer having an opening exposing the waveguide; a linear photodetector layer formed over the insulating layer and into the opening so as to make contact with the waveguide, the linear photodetector layer having a first end at the opening and a second end at the terminus of the linear photodetector layer, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end; a photodetector at the terminus of the linear photodetector layer; and a photodetector layer extension extends at an angle from the terminus of the linear photodetector layer.

According to a further aspect of the exemplary embodiments, there is provided a photodetector comprising: a waveguide extending over a substrate, the waveguide comprising silicon; an insulating layer formed over the waveguide, the insulating layer having an opening exposing the waveguide; a photodetector layer formed over the insulating layer and into the opening so as to make contact with the waveguide, the photodetector layer having a first end at the opening and a second end at a photodetector region formed in the photodetector layer, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end; a photodetector layer extension extends at an angle from the linear photodetector layer such that the photodetector layer and the photodetector layer extension are coplanar.

According to another aspect of the exemplary embodiments, there is provided a photodetector comprising: a waveguide extending over a substrate, the waveguide has an incoming portion that joins with a main portion, the incoming portion being at an angle with respect to the main portion; an insulating layer formed over the waveguide, the insulating layer having an opening exposing the main portion of the waveguide; a photodetector layer formed over the insulating layer and into the opening so as to make contact with the main portion of the waveguide, the photodetector layer having a first end at the opening and a second end spaced from the first end, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end; the main portion of the waveguide extends underneath the photodetector layer from where the main portion of the waveguide joins with the incoming portion of the waveguide to and past the opening, the incoming portion juts outward from underneath the photodetector layer, an extension portion of the photodetector layer extends past where the main portion of the waveguide joins with the incoming portion of the waveguide to the second end; and a photodetector region formed in the photodetector layer that begins where the incoming portion of the waveguide joins with the main portion of the waveguide and extends towards the first end.

According to yet another aspect of the exemplary embodiments, there is provided a photodetector comprising: a silicon waveguide extending over a substrate, the waveguide has an incoming portion that joins with a main portion, the incoming portion being at an angle with respect to the main portion; an insulating layer formed over the waveguide, the insulating layer having an opening exposing a silicon seed; a photodetector layer formed over the insulating layer and into the opening so as to make contact with the silicon seed, the photodetector layer having a first end at the opening and a second end spaced from the first end, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end; the main portion of the waveguide extends underneath the photodetector layer from where the main portion of the waveguide joins with the incoming portion of the waveguide to and past the second end, the incoming portion juts outward from underneath the photodetector layer, a portion of the photodetector layer extends past where the main portion of the waveguide joins with the incoming portion of the waveguide to the first end; and a photodetector region formed in the photodetector layer at the second end and over the main portion of the waveguide.

BRIEF DESCRIPTION OF SEVERAL VIEWS OF THE DRAWINGS

The features of the exemplary embodiments believed to be novel and the elements characteristic of the exemplary embodiments are set forth with particularity in the appended claims. The Figures are for illustration purposes only and are not drawn to scale. The exemplary embodiments, both as to organization and method of operation, may best be understood by reference to the detailed description which follows taken in conjunction with the accompanying drawings in which:

DETAILED DESCRIPTION

There are several advantages of the exemplary embodiments. One advantage is the creation of a photodetector with a silicon-rich region away from the incident light. Another advantage is a germanium-rich region near the incidence of the optical signal. A further advantage is a defect gettering region out of the path of the optical signal.

Figure 1:
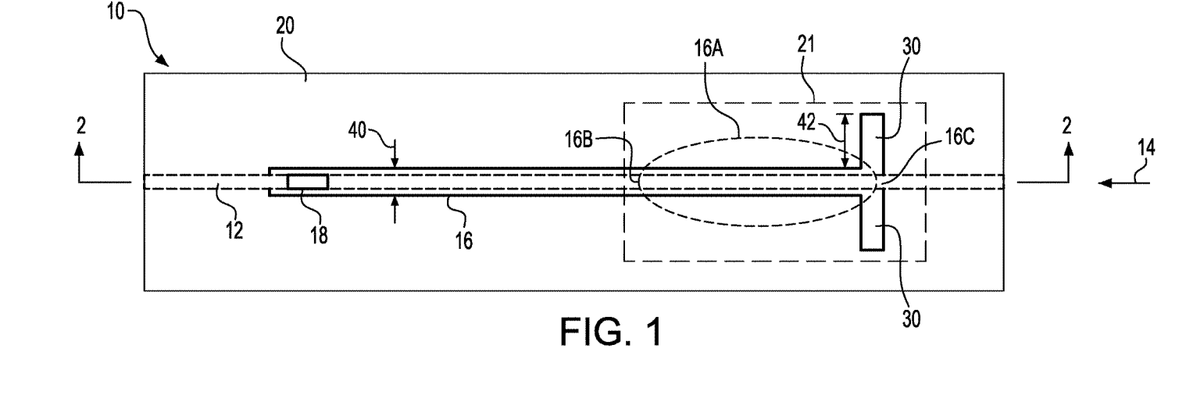
FIG. 1 is a plan view of an embodiment of a germanium photodetector.

Referring to the Figures in more detail, and particularly referring to FIG. 1, there is a plan view of an exemplary embodiment of a germanium photodetector 10. The germanium photodetector 10 includes a waveguide 12, usually silicon, with the incoming signal, indicated by arrow 14, as coming in to the germanium photodetector 10 from the right. The photodetector layer 16 makes contact with the underlying waveguide 12 through seed window 18. The right side of the photodetector layer 16, indicated by dashed oval 16A, contains a photodetector diode. Surrounding the photodetector layer 16 is an insulator 20, such as nitride. Surrounding the germanium photodetector 10 may be an oxide (not shown).

The formation of the germanium photodetector 10 (or any of the subsequent embodiments) may be accomplished in a CMOS (Complementary Metal Oxide Semiconductor) manufacturing line. It has been found that the exemplary embodiments formed by a CMOS process minimize the difficulties of the prior art with respect to contamination of the germanium and the formation of defects.

Figure 2:
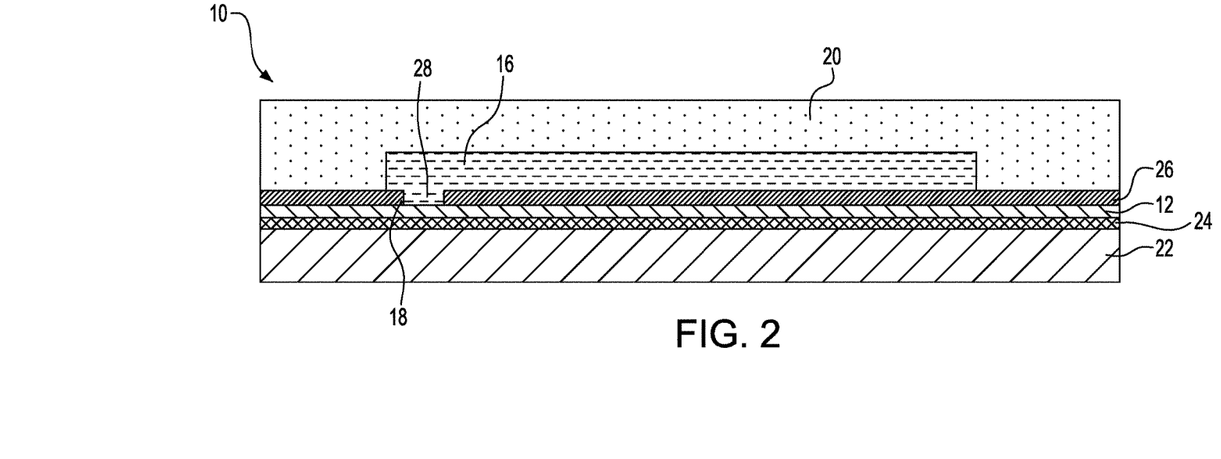
FIG. 2 is a cross sectional view of the germanium photodetector of FIG. 1 in the direction of arrows 2-2.

Referring now to FIG. 2, there is a cross sectional view of germanium photodetector 10 taken in the direction of arrows 2-2 in FIG. 1. The germanium photodetector 10 may be formed on a semiconductor base 22, such as silicon, followed by a buried oxide layer 24, the waveguide 12, an insulator layer 26, such as a nitride, the photodetector layer 16 and insulator 20. The photodetector layer 16 has a portion 28 which extends through seed window 18 to contact the waveguide 12.

The germanium photodetector 10 may be formed by a process that includes forming the waveguide 12 on the buried oxide layer 24 followed by the insulator 26. The seed window 18 may be formed in the insulator 26. Thereafter, poly-germanium or amorphous germanium may be deposited, including in the seed window 18, followed by patterning to form the photodetector layer 16. For purposes of illustration and not limitation, the photodetector layer 16 may have a width 40 as indicated in FIG. 1 in the range of 1 to 5 µm, for example a width of 2.5 µm. The germanium photodetector layer 16 may be encapsulated with the insulator 20 followed by heating to at least the melting point of germanium according to the RMG process.

As a result of the RMG process, a gradient of silicon germanium is formed. The mole fraction of silicon is highest at the seed window 18 and gradually decreases to zero or near zero at the photodetector diode 16A. Conversely, the mole fraction of germanium is lowest at the seed window and gradually increases to 100% or nearly 100% at the photodetector diode 16A. Preferably, the mole fraction of germanium at the left edge 16B of the photodetector diode 16A should be at least 95%.

The photodetector layer 16 further includes one or more photodetector layer extensions 30. For purposes of illustration and not limitation, the photodetector layer extensions may have a length 42 indicated in FIG. 1 of 1 to 10 μm, for example a length of 3 μm. An advantage of the photodetector extensions 30 is that defects that may ordinarily form at the end 16C of the photodetector layer 16 are now pushed into the photodetector layer extensions 30. Thus, the photodetector layer 16 within photodetector diode 16A is now free of these defects so that the yield and responsivity of the photodetector diode 16A is improved.

Figure 3:
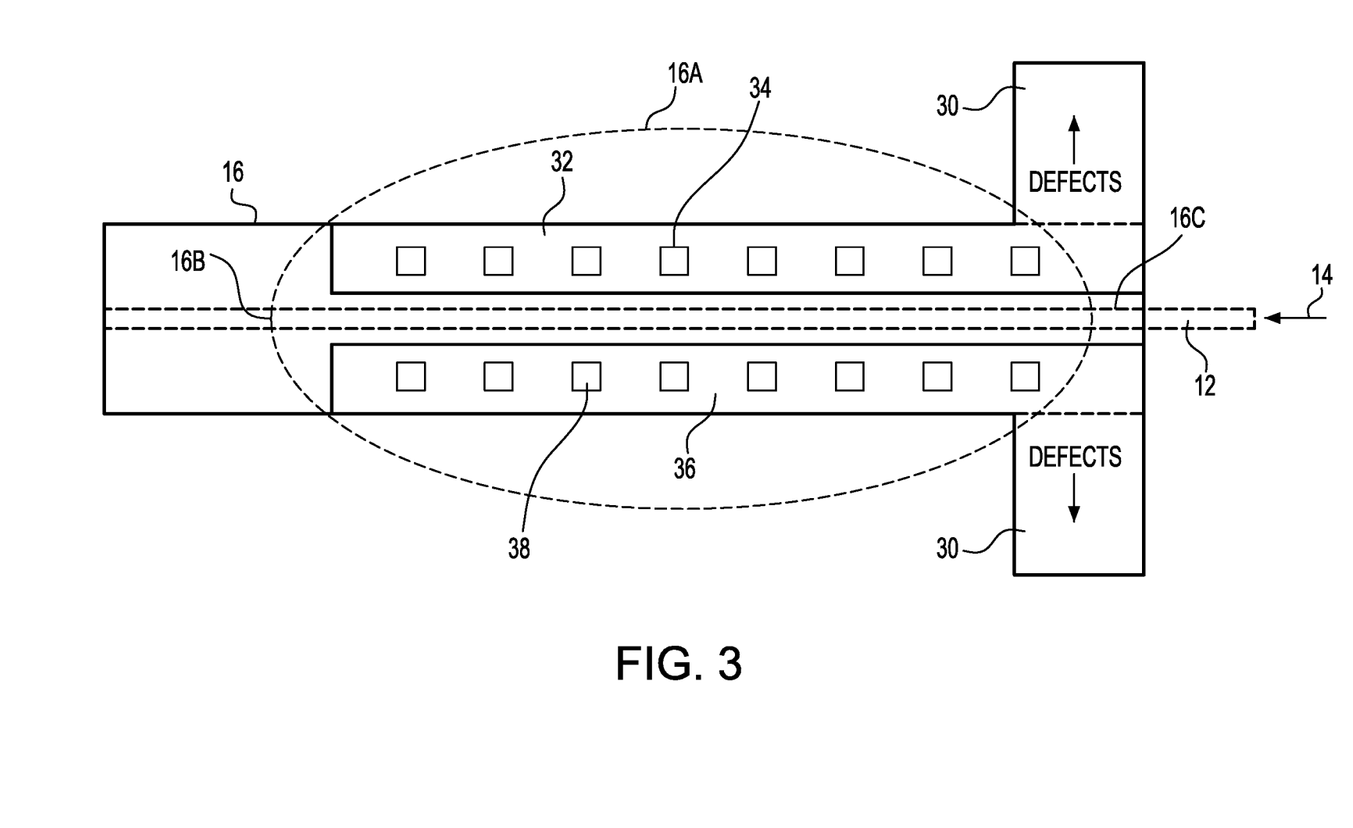
FIG. 3 is an enlarged plan view of a section of the germanium photodetector of FIG. 1 circumscribed by the dashed rectangle in FIG. 1.

Referring now to FIG. 3, the photodetector diode 16A within rectangle 21 of FIG. 1 is shown in more detail. One portion 32 of the photodetector diode 16A may be n doped and metal contacts 34 formed while a second portion 36 may be p doped and metal contacts 38 formed. The insulator 20 may be optionally removed for doping of the photodetector diode 16A after the RMG process to minimize doping implant energy. If the insulator 20 remains in place, the metal contacts 34 may be formed by locally etching through the insulator 20 and then depositing metal for the metal contacts 34.

Also shown in more detail are photodetector layer extensions 30 which angle off to the side of the photodetector layer 16. The photodetector layer extensions 30 are shown as being perpendicular to photodetector layer 16 but lesser or greater angular extensions may also be formed. The dashed lines indicate where the photodetector layer 16 ends and the photodetector layer extensions 30 begin.

Figure 4A:
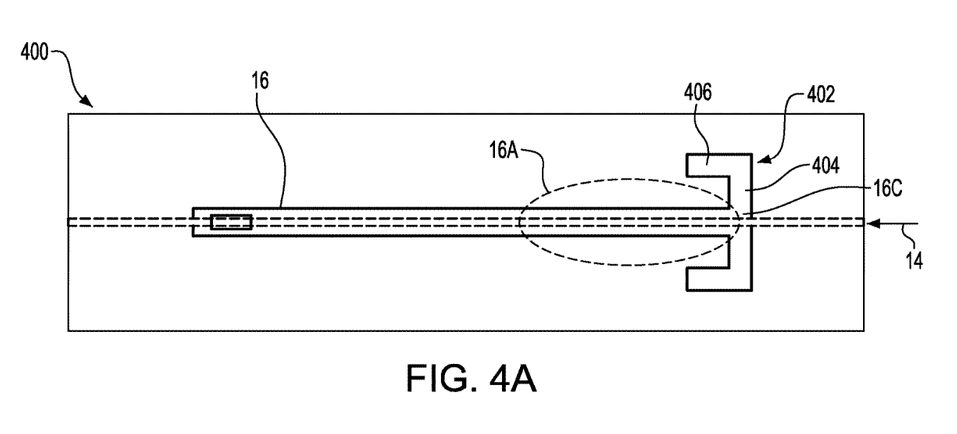
FIG. 4A is a plan view of another embodiment of a germanium photodetector and FIG. 4B is a plan view of a modified version of the germanium photodetector of FIG. 4A.

Referring now to FIG. 4A, another exemplary embodiment of a germanium photodetector 400 is illustrated which is similar to germanium photodetector 10 except that germanium photodetector 400 has different photodetector layer extensions 402. The photodetector layer extensions 402 include photodetector layer extension portions 404 which angle off to the side of photodetector layer 16 and photodetector layer extension portions 406 which angle off to the side of photodetector layer extension portions 404. In one embodiment, photodetector layer extension portions 406 may be parallel to photodetector layer 16.

Figure 4B:
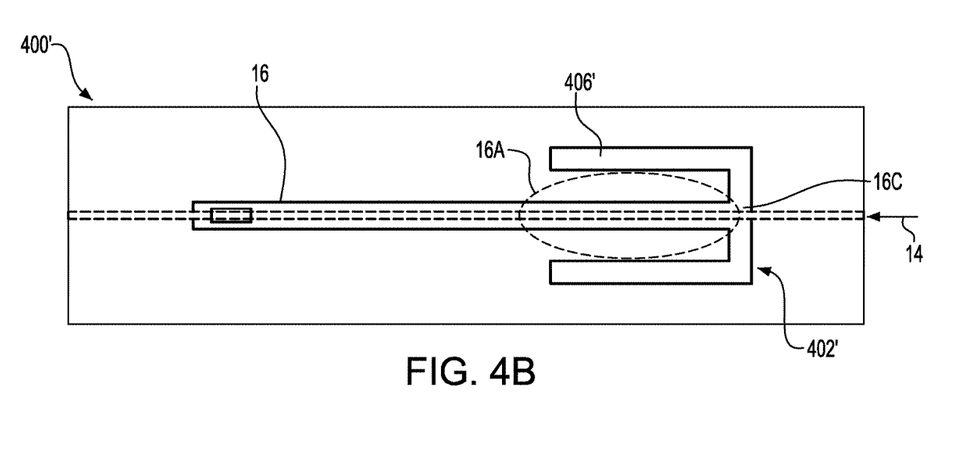

Referring now to FIG. 4B, the germanium photodetector 400 has been modified, now germanium photodetector 400', in that the photodetector layer extension portions 406 have been increased in length and now shown as photodetector layer extension portions 406'.

An advantage of germanium photodetectors 400, 400' is that any defects during the recrystallization of the germanium are pushed further past the end 16C of the germanium photodetector layer 16 into the photodetector layer extensions 402.

Figure 5:
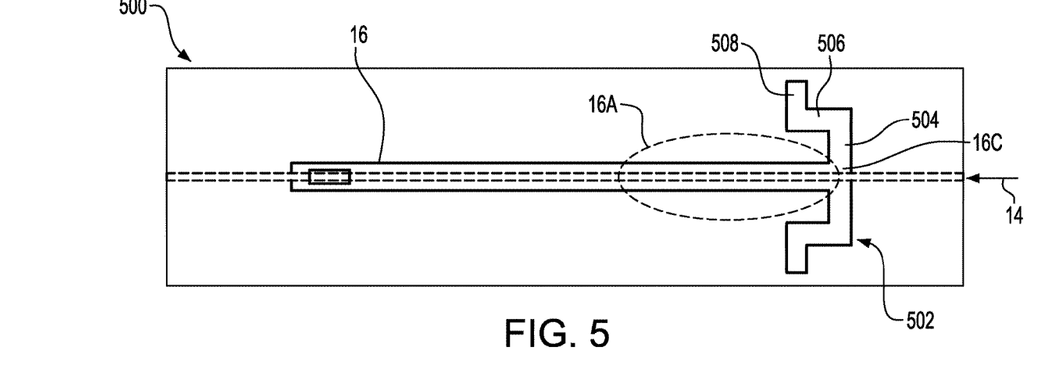
FIG. 5 is a plan view of another embodiment of a germanium photodetector.

Referring now to FIG. 5, another exemplary embodiment of a germanium photodetector 500 is illustrated which is similar to germanium photodetector 10 except that germanium photodetector 500 has different photodetector layer extensions 502. The photodetector layer extensions 502 include photodetector layer extension portions 504 which angle off to the side of photodetector layer 16 and photodetector layer extension portions 506 which angle off to the side of photodetector layer extension portions 504. In one embodiment, photodetector layer extension portions 506 may be parallel to photodetector layer 16. Germanium photodetector 500 may include additional photodetector layer extensions 508 which may angle off to the side of photodetector layer extensions 506.

An advantage of germanium photodetector 500 is that any defects during the recrystallization of the germanium are pushed further past the end 16C of the germanium photodetector layer 16 into the photodetector layer extensions 502.

Figure 6:
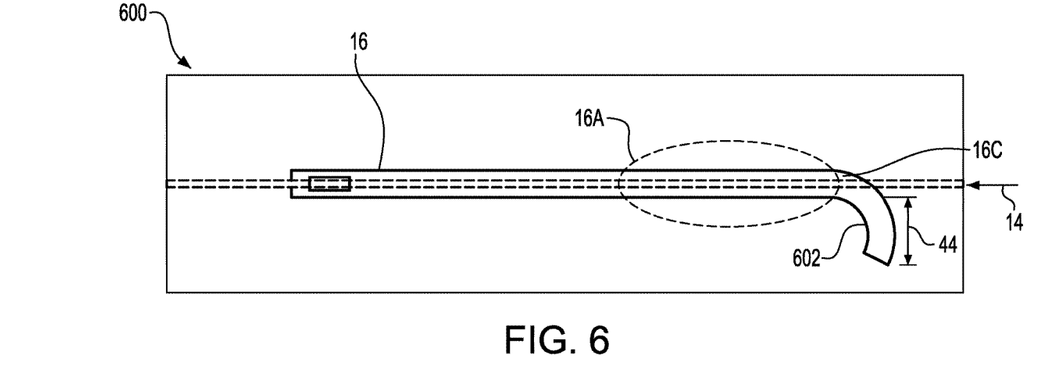
FIG. 6 is a plan view of another embodiment of a germanium photodetector.

Referring now to FIG. 6, another exemplary embodiment of a germanium photodetector 600 is illustrated which is similar to germanium photodetector 10 except that germanium photodetector 600 has a different photodetector layer extension 602. The photodetector layer extension 602 curves off to one side of photodetector layer 16. For purposes of illustration and not limitation, the photodetector layer extension 602 may deviate to one side 44 as indicated in FIG. 6 by 1 to 10 μm, for example 5 μm.

An advantage of germanium photodetector 600 is that any defects during the recrystallization of the germanium are pushed further past the end 16C of the germanium photodetector layer 16 into the photodetector layer extensions 602.

Figure 7:
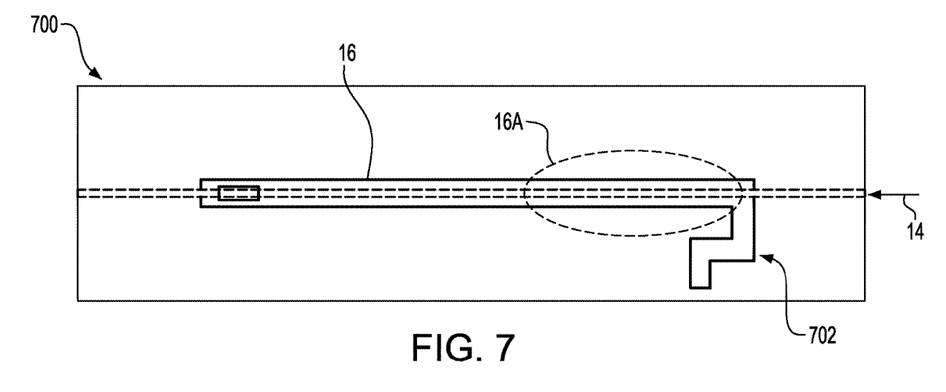
FIG. 7 is a plan view of another embodiment of a germanium photodetector.

The previous germanium photodetectors 10, 400, 400', 500 all had photodetector layer extensions 30, 402, 402', 502 that angled off to both sides of the germanium photodetector layer 16. It is within the scope of the exemplary embodiments for the photodetector layer extensions 30, 402, 402', 502 to angle off to only one side as is the case with the photodetector layer extensions 602 of the germanium photodetector 600. Germanium photodetector 700 in FIG. 7 is one such example where the photodetector layer extension 702 angles off to only one side of the germanium photodetector layer 16 as compared to germanium photodetector 500 where the photodetector layer extensions 502 angle off to both sides of the germanium photodetector layer 16.

Figure 8:
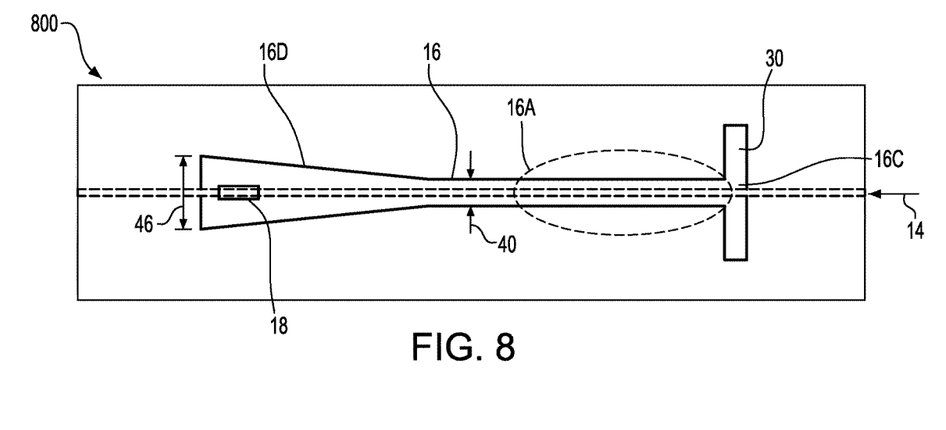
FIG. 8 is a plan view of another embodiment of a germanium photodetector.

Referring now to FIG. 8, another exemplary embodiment of a germanium photodetector 800 is illustrated which is similar to germanium photodetector 10 except that germanium photodetector 800 has a wider portion 16D of the photodetector layer 16 near the seed window 18. For purposes of illustration and not limitation, the photodetector layer 16 may have a width 40 as indicated in FIG. 8 in the range of 0.5 to 3 μm, for example a width of 1.0 μm. Further, for purposes of illustration and not limitation, the wider portion 16D may have a maximum width 46 as indicated in FIG. 8 of 1.5 to 5 times, for example 3 times, the width 40 of the photodetector layer 16. It is noted that the wider portion 16D gradually tapers from the seed window 18 to where the wider portion 16 meets the remaining photodetector layer 16.

An advantage of germanium photodetector 800 is that any defects during the recrystallization of the germanium are pushed further past the end 16C of the germanium photodetector layer 16 into the photodetector layer extensions 30. Another advantage of germanium photodetector 800 is that the wider portion 16D of the photodetector layer 16 helps to increase the mole fraction of germanium in the photodetector diode 16A.

Figure 9:
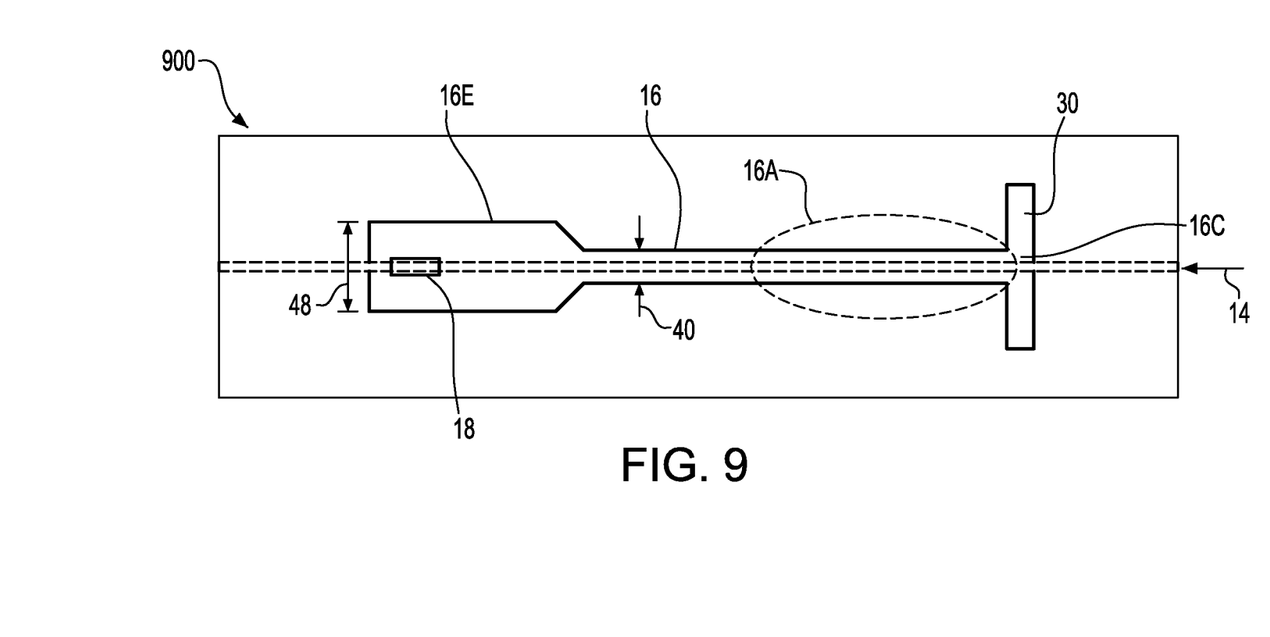
FIG. 9 is a plan view of another embodiment of a germanium photodetector.

Referring now to FIG. 9, another exemplary embodiment of a germanium photodetector 900 is illustrated which is similar to germanium photodetector 800 except that germanium photodetector 900 has a different wider portion 16E of the photodetector layer 16 near the seed window 18. For purposes of illustration and not limitation, the photodetector layer 16 may have a width 40 as indicated in FIG. 9 in the range of 0.5 to 3 μm, for example a width of 1.0 μm. Further, for purposes of illustration and not limitation, the wider portion 16E may have a maximum width 48 as indicated in FIG. 9 of 1.5 to 5 times, for example 3 times, the width 40 of the photodetector layer 16. It is noted that the wider portion 16E of germanium photodetector 900 has a uniform width near the seed window and then gradually tapers to the main portion of the photodetector layer 16.

An advantage of germanium photodetector 900 is that any defects during the recrystallization of the germanium are pushed further past the end 16C of the germanium photodetector layer 16 into the photodetector layer extensions 30. Another advantage of germanium photodetector 900 is that the wider portion 16D of the photodetector layer 16 helps to increase the mole fraction of germanium in the photodetector diode 16A.

Figure 10:
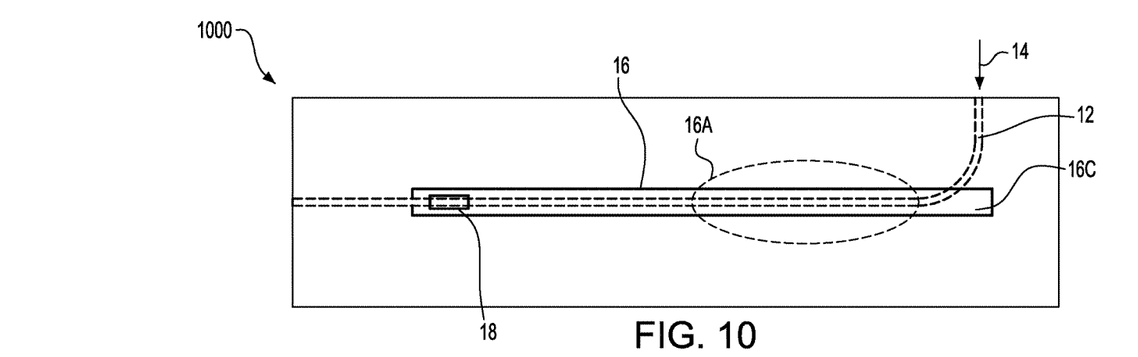
FIG. 10 is a plan view of another embodiment of a germanium photodetector

Referring now to FIG. 10, another exemplary embodiment of a germanium photodetector 1000 is illustrated which is similar to germanium photodetector 10 but differs in some respects. It is noted that germanium photodetector 1000 does not have the photodetector layer extensions previously described with respect to germanium photodetector 10. It is further noted that the waveguide 12 having incoming light 14 of germanium photodetector 1000 angles underneath the photodetector layer 16 from the side and thereafter proceeds underneath the photodetector layer 16 past the seed window 18. The waveguide 12 proceeds underneath the photodetector layer 16 at a point to the left of the end 16C of the photodetector layer 16. The distance between where the waveguide 12 angles underneath the photodetector layer 16 and the end 16C of the photodetector layer 16 may be empirically determined as to be in the region 16A where defects are minimized. This distance depends on the defect formation details of the process used to form the germanium photodetector 10.

The advantage of germanium photodetector 1000 is that the defects are present at the end 16C of the photodetector layer 16 and not in the portion of the photodetector layer 16 that comprises the photodetector diode 16A. The result is that the photodetector diode 16A is in the high responsivity and low defect region.

Figure 11:
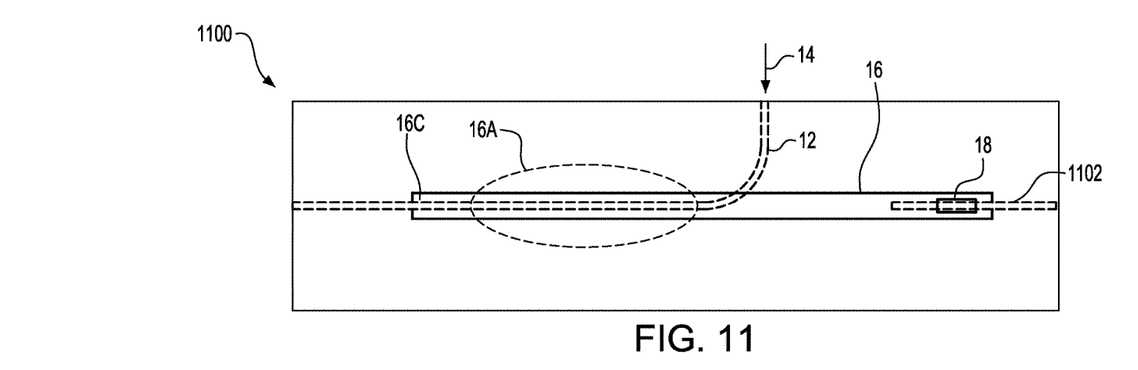
FIG. 11 is a plan view of another embodiment of a germanium photodetector.

Referring now to FIG. 11, another exemplary embodiment of a germanium photodetector 1100 is illustrated which is similar to germanium photodetector 10 but differs in some respects. It is noted that germanium photodetector 1100 does not have the photodetector layer extensions previously described with respect to germanium photodetector 10. It is further noted that the waveguide 12 having incoming light 14 of germanium photodetector 1000 angles underneath the photodetector layer 16 from the side and thereafter proceeds underneath the photodetector layer 16. The path of the light from the waveguide 12 is from where the waveguide 12 angles underneath the photodetector layer 16 through the end 16C of the photodetector layer 16. The light from the waveguide 12 never passes by the seed window 18. In this regard, the waveguide 12 is decoupled from another waveguide 1102 that is underneath the seed window 18. During the RMG process, the photodetector layer 16 recrystallizes from the waveguide 1102 and not waveguide 12 as in the previous embodiments. Further, the photodetector diode 16A is chosen at a location before the end 16C so that the photodetector diode 16A is at a high germanium mole fraction region but before the end 16C of the photodetector layer 16 where defects might accumulate. The distance between the end 16C and the location of the photodetector diode 16A may be empirically determined as to be in the region 16A where defects are minimized.

The advantage of germanium photodetector 1100 is that the defects are present at the end 16C of the photodetector layer 16 and not in the photodetector diode 16A. The result is that the photodetector diode 16A is in the high responsivity and low defect region.

It will be apparent to those skilled in the art having regard to this disclosure that other modifications of the exemplary embodiments beyond those embodiments specifically described here may be made without departing from the spirit of the invention. Accordingly, such modifications are considered within the scope of the invention as limited solely by the appended claims.

What is claimed is:

1. A photodetector comprising:
 a waveguide extending over a substrate, the waveguide comprising a waveguide material;
 an insulating layer formed over the waveguide, the insulating layer having an opening exposing the waveguide;
 a photodetector layer formed over the insulating layer and into the opening so as to make contact with the waveguide, the photodetector layer having a first end at the opening and a second end distal from the opening, the photodetector layer being a gradient material of the waveguide material and germanium wherein a waveguide material portion of the gradient material varies from a maximum at the first end to a minimum at the second end and wherein a germanium portion of the gradient material varies from a minimum at the first end to a maximum at the second end;
 a photodetector region at the second end; and
 a photodetector layer extension extends at an angle from the photodetector layer at the second end.

2. The photodetector of claim 1 wherein the photodetector layer extension does not contain any portion of the photodetector region.

3. The photodetector of claim 1 wherein the photodetector layer extension is L shaped.

4. The photodetector of claim 1 wherein the photodetector layer extension is curved.

5. The photodetector of claim 1 wherein the photodetector layer and the photodetector layer extension are coplanar.

6. The photodetector of claim 1 wherein the waveguide material comprises silicon.

7. The photodetector of claim 1 wherein the photodetector layer has a width at the first end that is wider than a width of the photodetector layer at the second end.

8. The photodetector of claim 1 wherein the photodetector layer extension extends at an angle from the photodetector layer in only one direction.

9. A photodetector comprising:
 a waveguide extending over a substrate, the waveguide comprising silicon;
 an insulating layer formed over the waveguide, the insulating layer having an opening exposing the waveguide;
 a linear photodetector layer formed over the insulating layer and into the opening so as to make contact with the waveguide, the linear photodetector layer having a first end at the opening and a second end at the terminus of the linear photodetector layer, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end;
 a photodetector at the terminus of the linear photodetector layer; and
 a photodetector layer extension extends at an angle from the terminus of the linear photodetector layer.

10. The photodetector of claim 9 wherein the photodetector layer extension extends at an angle from the linear photodetector layer in only one direction.

11. The photodetector of claim 9 wherein the photodetector layer extension extends at an angle from the linear photodetector layer in two directions.

12. The photodetector of claim 9 wherein the photodetector layer extension comprises a portion parallel and spaced from the linear photodetector layer.

13. The photodetector of claim 9 wherein the photodetector layer extension is curved.

14. The photodetector of claim 9 wherein the photodetector layer and the photodetector layer extension are coplanar.

15. The photodetector of claim 9 wherein the photodetector layer has a width at the first end that is wider than a width of the photodetector layer at the second end.

16. A photodetector comprising:
a waveguide extending over a substrate, the waveguide comprising silicon;
an insulating layer formed over the waveguide, the insulating layer having an opening exposing the waveguide;
a photodetector layer formed over the insulating layer and into the opening so as to make contact with the waveguide, the photodetector layer having a first end at the opening and a second end at a photodetector region formed in the photodetector layer, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end;
a photodetector layer extension extends at an angle from the photodetector layer such that the photodetector layer and the photodetector layer extension are coplanar.

17. The photodetector of claim 16 wherein the photodetector layer extension does not contain any portion of the photodetector region.

18. The photodetector of claim 16 wherein the photodetector layer extension extends at an angle from the linear photodetector layer in only one direction.

19. The photodetector of claim 16 wherein the photodetector layer extension extends at an angle from the linear photodetector layer in two directions.

20. The photodetector of claim 16 wherein the photodetector layer extension comprises a portion parallel and spaced from the linear photodetector layer.

21. The photodetector of claim 16 wherein the photodetector layer has a width at the first end that is wider than a width of the photodetector layer at the second end.

22. A photodetector comprising:
a waveguide extending over a substrate, the waveguide has an incoming portion that joins with a main portion, the incoming portion being at an angle with respect to the main portion;
an insulating layer formed over the waveguide, the insulating layer having an opening exposing the main portion of the waveguide;
a photodetector layer formed over the insulating layer and into the opening so as to make contact with the main portion of the waveguide, the photodetector layer having a first end at the opening and a second end spaced from the first end, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end;
the main portion of the waveguide extends underneath the photodetector layer from where the main portion of the waveguide joins with the incoming portion of the waveguide to and past the opening, the incoming portion juts outward from underneath the photodetector layer, an extension portion of the photodetector layer extends past where the main portion of the waveguide joins with the incoming portion of the waveguide to the second end; and
a photodetector region formed in the photodetector layer that begins where the incoming portion of the waveguide joins with the main portion of the waveguide and extends towards the first end.

23. The photodetector of claim 22 wherein the extension portion of the photodetector layer does not contain any portion of the photodetector.

24. A photodetector comprising:
a silicon waveguide extending over a substrate, the waveguide has an incoming portion that joins with a main portion, the incoming portion being at an angle with respect to the main portion;
an insulating layer formed over the waveguide, the insulating layer having an opening exposing a silicon seed;
a photodetector layer formed over the insulating layer and into the opening so as to make contact with the silicon seed, the photodetector layer having a first end at the opening and a second end spaced from the first end, the photodetector layer being a gradient material of the silicon and germanium wherein a silicon portion of the gradient material varies from a maximum at the first end to a minimum at the second end and wherein a germanium portion of the gradient material varies from a minimum at the first end to a maximum at the second end;
the main portion of the waveguide extends underneath the photodetector layer from where the main portion of the waveguide joins with the incoming portion of the waveguide to and past the second end, the incoming portion juts outward from underneath the photodetector layer, a portion of the photodetector layer extends past where the main portion of the waveguide joins with the incoming portion of the waveguide to the first end; and
a photodetector region formed in the photodetector layer at the second end and over the main portion of the waveguide.

25. The photodetector of claim 24 wherein the silicon seed is decoupled from the waveguide.

* * * * *